(12) United States Patent
Schneegans et al.

(10) Patent No.: US 9,368,436 B2
(45) Date of Patent: Jun. 14, 2016

(54) SOURCE DOWN SEMICONDUCTOR DEVICES AND METHODS OF FORMATION THEREOF

(71) Applicant: Infineon Technologies AG, Neubiberg (DE)

(72) Inventors: Manfred Schneegans, Vaterstetten (DE);
Andreas Meiser, Sauerlach (DE);
Martin Mischitz, Wernberg (AT);
Michael Roesner, Villach (AT); Michael Pinczolits, Villach (AT)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 14/614,119

(22) Filed: Feb. 4, 2015

(65) Prior Publication Data
US 2016/0035654 A1      Feb. 4, 2016

Related U.S. Application Data

(63) Continuation-in-part of application No. 14/451,043, filed on Aug. 4, 2014.

(51) Int. Cl.
*H01L 21/78*      (2006.01)
*H01L 23/528*      (2006.01)
(Continued)

(52) U.S. Cl.
CPC ...... *H01L 23/49562* (2013.01); *H01L 21/4807* (2013.01); *H01L 21/78* (2013.01); *H01L 23/49503* (2013.01); *H01L 23/49582* (2013.01); *H01L 23/49586* (2013.01); *H01L 23/528* (2013.01); *H01L 24/03* (2013.01); *H01L 24/08* (2013.01); *H01L 24/97* (2013.01); *H01L 2224/08245* (2013.01); *H01L 2924/01029* (2013.01); *H01L 2924/0532* (2013.01); *H01L 2924/05341* (2013.01); *H01L 2924/05432* (2013.01); *H01L 2924/05442* (2013.01); *H01L 2924/13091* (2013.01);
(Continued)

(58) Field of Classification Search
USPC .......................................................... 257/30
See application file for complete search history.

(56) References Cited

U.S. PATENT DOCUMENTS 5,919,325 A * 7/1999 Goebel et al. ............... 156/89.16
6,423,570 B1 * 7/2002 Ma ........................ H01L 21/561
                                                              257/612
(Continued)

OTHER PUBLICATIONS

Fischer et al, "Silicon on Ceramics—A New Concept for Micro-Nano-Integration on Wafer Level", NSTI-Nanotech 2008, www.nsti.org, vol. 3, 157-160.*
(Continued)

*Primary Examiner* — Jarrett Stark
*Assistant Examiner* — Charles N Ausar-El
(74) *Attorney, Agent, or Firm* — Slater Matsil, LLP

(57) ABSTRACT

A method for forming a semiconductor device includes forming device regions in a semiconductor substrate having a first side and a second side. The device regions are formed adjacent the first side. The method further includes forming a seed layer over the first side of the semiconductor substrate, and forming a patterned resist layer over the seed layer. A contact pad is formed over the seed layer within the patterned resist layer. The method further includes removing the patterned resist layer after forming the contact pad to expose a portion of the seed layer underlying the patterned resist layer, and forming a protective layer over the exposed portion of the seed layer.

21 Claims, 18 Drawing Sheets

(51) Int. Cl.
*H01L 23/495* (2006.01)
*H01L 21/48* (2006.01)
*H01L 23/00* (2006.01)

(52) U.S. Cl.
CPC ............ *H01L 2924/2011* (2013.01); *H01L 2924/20109* (2013.01); *H01L 2924/20111* (2013.01)

(56) References Cited

U.S. PATENT DOCUMENTS

| | | | | |
|---|---|---|---|---|
| 7,728,507 | B2* | 6/2010 | Winter et al. | 313/498 |
| 8,391,013 | B2* | 3/2013 | Fischer et al. | 361/748 |
| 9,165,821 | B2* | 10/2015 | Rogalli | H01L 21/02178 |
| 2003/0119431 | A1* | 6/2003 | Boyd et al. | 451/289 |
| 2005/0051253 | A1* | 3/2005 | Tosa et al. | 156/89.11 |
| 2005/0169818 | A1* | 8/2005 | Ohno et al. | 422/177 |
| 2005/0186407 | A1* | 8/2005 | Mori et al. | 428/210 |
| 2008/0001290 | A1* | 1/2008 | Chou et al. | 257/751 |
| 2008/0233416 | A1* | 9/2008 | Takase | 428/480 |
| 2010/0167017 | A1* | 7/2010 | Takamatsu et al. | 428/168 |
| 2011/0018116 | A1* | 1/2011 | Feng | 257/690 |
| 2013/0026633 | A1* | 1/2013 | Schneegans | H01L 23/53223 257/758 |
| 2013/0032855 | A1* | 2/2013 | Macheiner et al. | 257/140 |
| 2014/0197523 | A1* | 7/2014 | Otremba et al. | 257/666 |
| 2014/0210054 | A1* | 7/2014 | Kosub et al. | 257/618 |
| 2014/0217597 | A1 | 8/2014 | Lin et al. | |
| 2014/0264865 | A1* | 9/2014 | Schneegans et al. | 257/751 |
| 2015/0102498 | A1* | 4/2015 | Enicks et al. | 257/774 |
| 2015/0206802 | A1* | 7/2015 | Roesner et al. | |
| 2015/0214095 | A1* | 7/2015 | Mischitz et al. | |

OTHER PUBLICATIONS

Fischer et al, "Bonding of ceramic and silicon—new options and applications", Technische Universitat Llmenau, also cited as Fischer et al, "Bonding of ceramic and silicon—new options and applications", Smart Systems, 2007 in U.S. Pat. No. 8,391,013.*
Disco Corporation, "Taiko Process," Kiru-Kezuru-Migaku Technologies, http:www.discousa.com/eg/solution/library/taiko.html, Jul. 28, 2014, pp. 1-3.

* cited by examiner

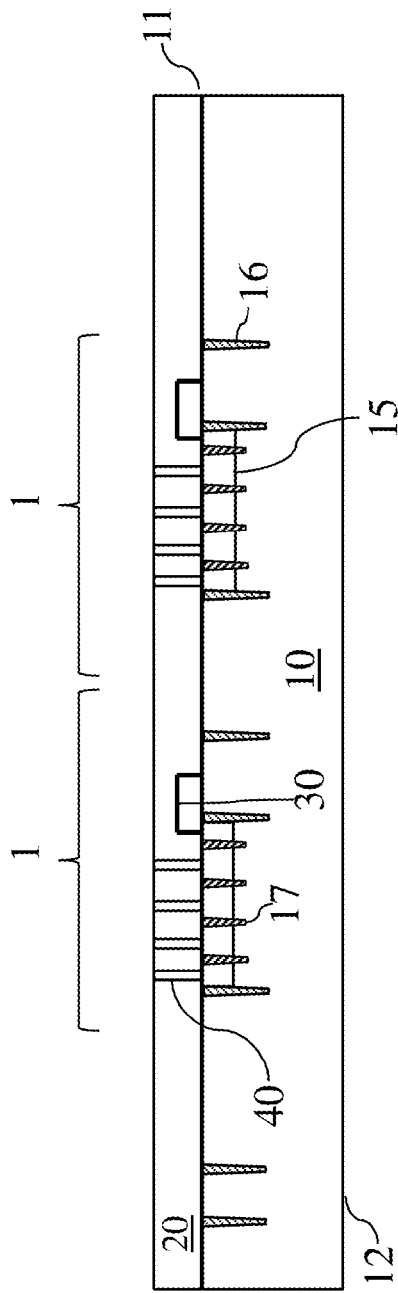
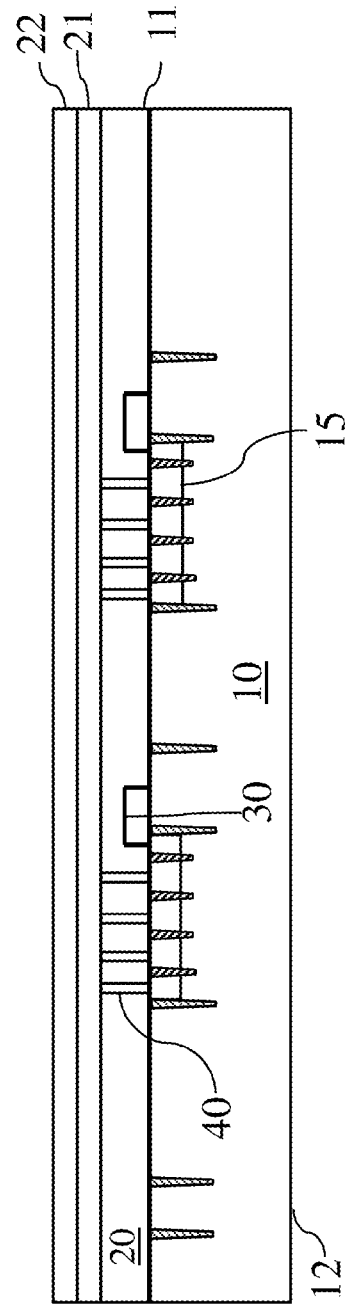
FIGURE 1A
FIGURE 1B

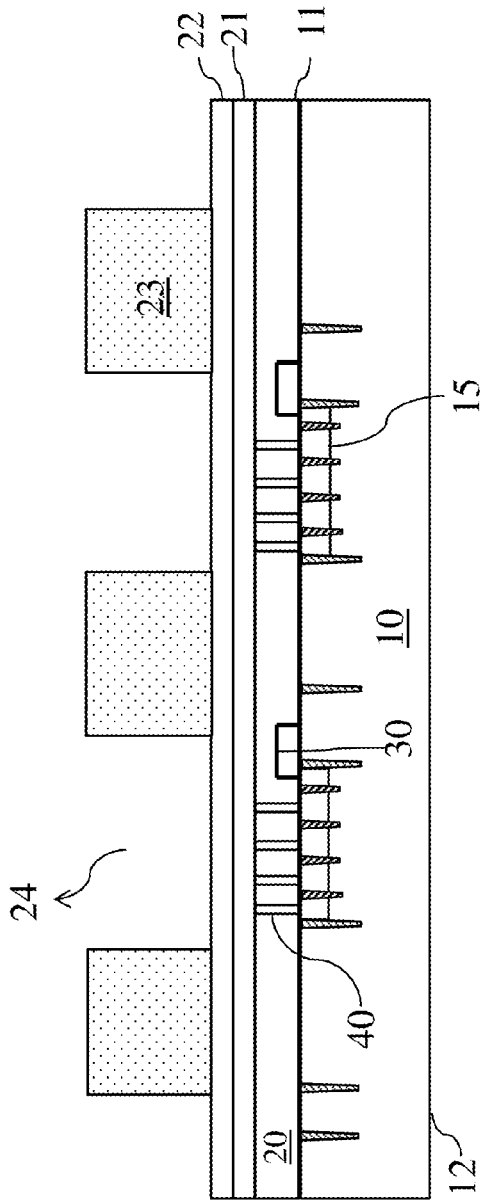
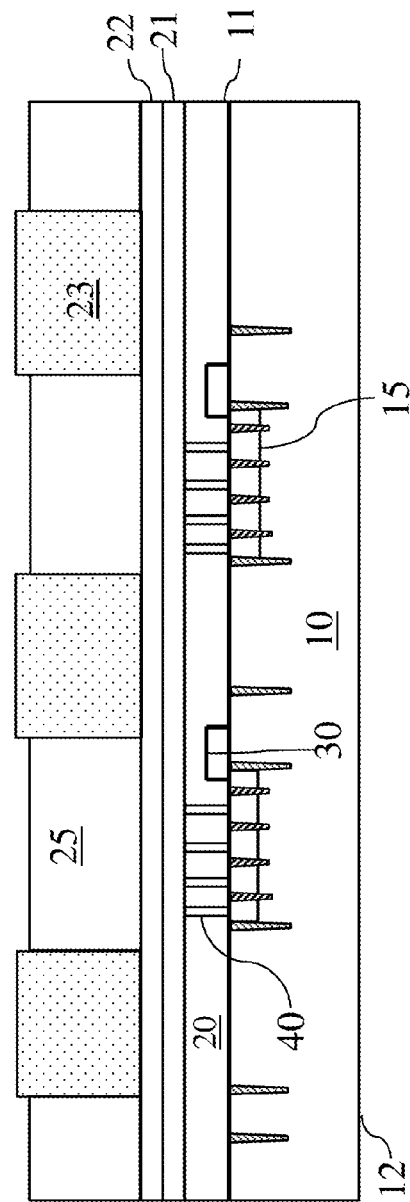
FIGURE 1C
FIGURE 1D

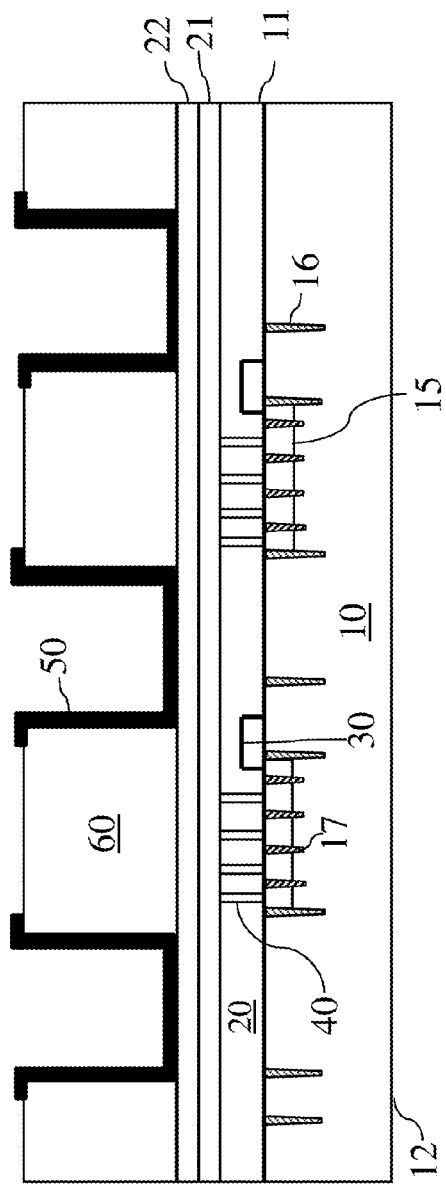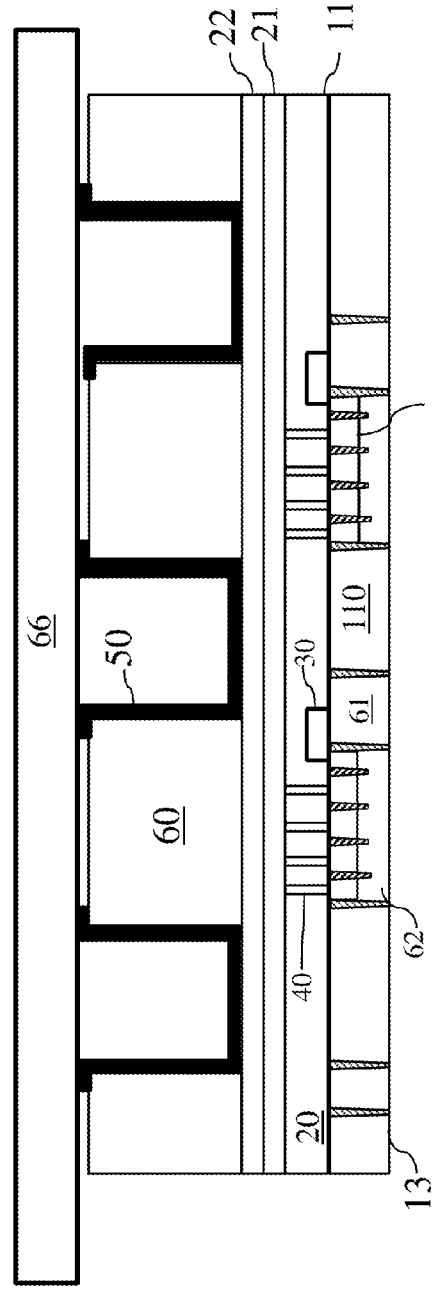
FIGURE 1E
FIGURE 1F

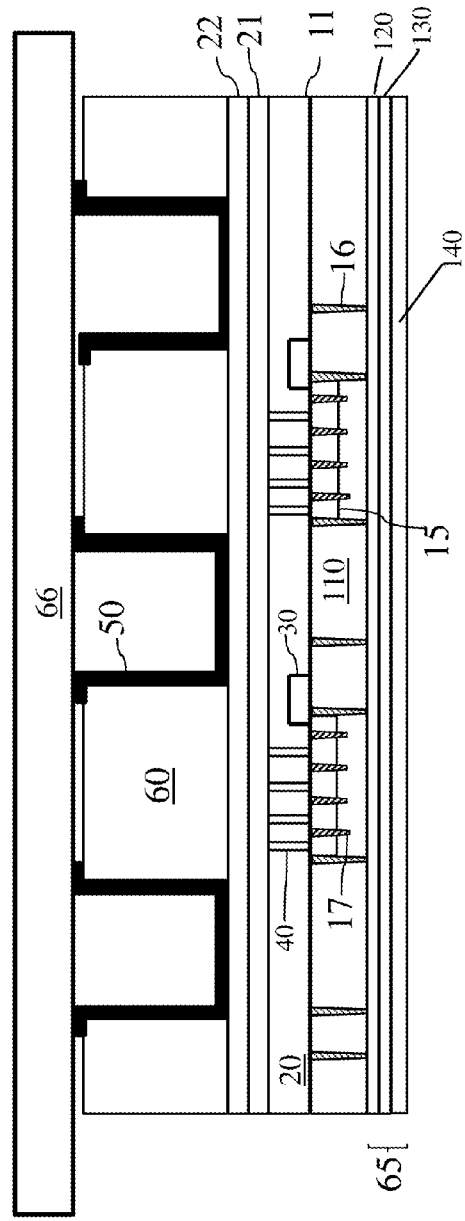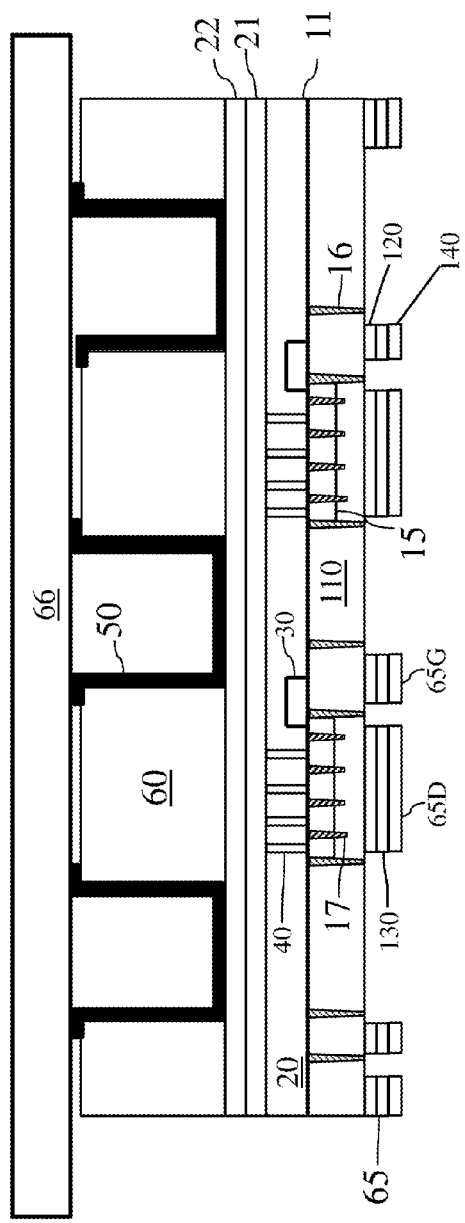

SOURCE DOWN SEMICONDUCTOR DEVICES AND METHODS OF FORMATION THEREOF

This application is a Continuation in Part of U.S. Non Provisional application Ser. No. 14/451,043, filed on Aug. 4, 2014, which application is hereby incorporated herein by reference.

TECHNICAL FIELD

The present invention relates generally to semiconductor devices, and, in particular embodiments, to source down semiconductor devices and methods of formation thereof.

BACKGROUND

Semiconductor devices are used in many electronic and other applications. Semiconductor devices may comprise integrated circuits that are formed on semiconductor wafers. Alternatively, semiconductor devices may be formed as monolithic devices, e.g., discrete devices. Semiconductor devices are formed on semiconductor wafers by depositing many types of thin films of material over the semiconductor wafers, patterning the thin films of material, doping selective regions of the semiconductor wafers, etc.

In a conventional semiconductor fabrication process, a large number of semiconductor devices are fabricated in a single wafer. Each wafer is processed either in batch mode or individually because some processes work best on one wafer at time. Processes that require mechanical forces such as polishing, singulation, grinding, and others are not only individually handled but may also be mounted on a carrier for providing additional support and stability during processing.

SUMMARY

In accordance with an embodiment of the present invention, a method for forming a semiconductor device comprises forming device regions in a semiconductor substrate comprising a first side and a second side. The device regions are formed adjacent the first side. The method further includes forming a seed layer over the first side of the semiconductor substrate, and forming a patterned resist layer over the seed layer. A contact pad is formed over the seed layer within the patterned resist layer. The method further includes removing the patterned resist layer after forming the contact pad to expose a portion of the seed layer underlying the patterned resist layer, and forming a protective layer over the exposed portion of the seed layer.

In accordance with another embodiment of the present invention, a method for forming a semiconductor device comprises forming a seed layer over a first side of a semiconductor substrate. The semiconductor substrate comprises device regions at the first side. The method includes forming a contact pad over the seed layer while exposing a portion of the seed layer adjacent the contact pad, and forming a protective layer over the exposed portion of the seed layer. A paste is applied over a semiconductor substrate. The paste covers the protective layer. The method further includes forming a ceramic carrier by solidifying the paste, and processing the semiconductor substrate using the ceramic carrier as a carrier.

In accordance with another embodiment of the present invention, a semiconductor device comprises a chip, which comprises a diced semiconductor substrate, and a seed layer disposed over and overlapping with an entire major surface of the diced semiconductor substrate. A patterned contact pad is disposed over and covering a portion of the seed layer. A diced carrier material is disposed over the diced semiconductor substrate and disposed at sidewalls of the patterned contact pad.

BRIEF DESCRIPTION OF THE DRAWINGS

For a more complete understanding of the present invention, and the advantages thereof, reference is now made to the following descriptions taken in conjunction with the accompanying drawings, in which:

FIG. 1A illustrates a cross-sectional view of a semiconductor device during fabrication after the completion of front end processing in accordance with an embodiment of the present invention;

FIG. 1B illustrates a cross-sectional view of a semiconductor device during fabrication after forming the barrier layer and the seed layer in accordance with an embodiment of the present invention;

FIG. 1C illustrates a cross-sectional view of a semiconductor device during fabrication after forming a structured resist layer in accordance with an embodiment of the present invention;

FIG. 1D illustrates a cross-sectional view of a semiconductor device during fabrication after depositing a conductive material for forming contact pads in accordance with an embodiment of the present invention;

FIG. 1E illustrates a cross-sectional view of a semiconductor device during fabrication after forming contact pads by removing the resist layer in accordance with an embodiment of the present invention;

FIG. 1F illustrates a cross-sectional view of a semiconductor device during fabrication after mounting on a carrier in accordance with an embodiment of the present invention;

FIG. 1G illustrates the semiconductor substrate after formation of a back side metallization layer in accordance with an embodiment of the present invention;

FIG. 1H illustrates the semiconductor substrate after patterning the back side metallization layer in accordance with an embodiment of the present invention;

FIG. 1I illustrates the semiconductor substrate after singulation in accordance with an embodiment of the present invention;

FIGS. 2H and 2I illustrates the carrier and the substrate placed on a frame with a dicing tape in preparation for singulation in accordance with an embodiment of the present invention, wherein FIG. 2I illustrates a cross-sectional view and FIG. 2H illustrates a top view;

DETAILED DESCRIPTION OF ILLUSTRATIVE EMBODIMENTS

Figure 11:
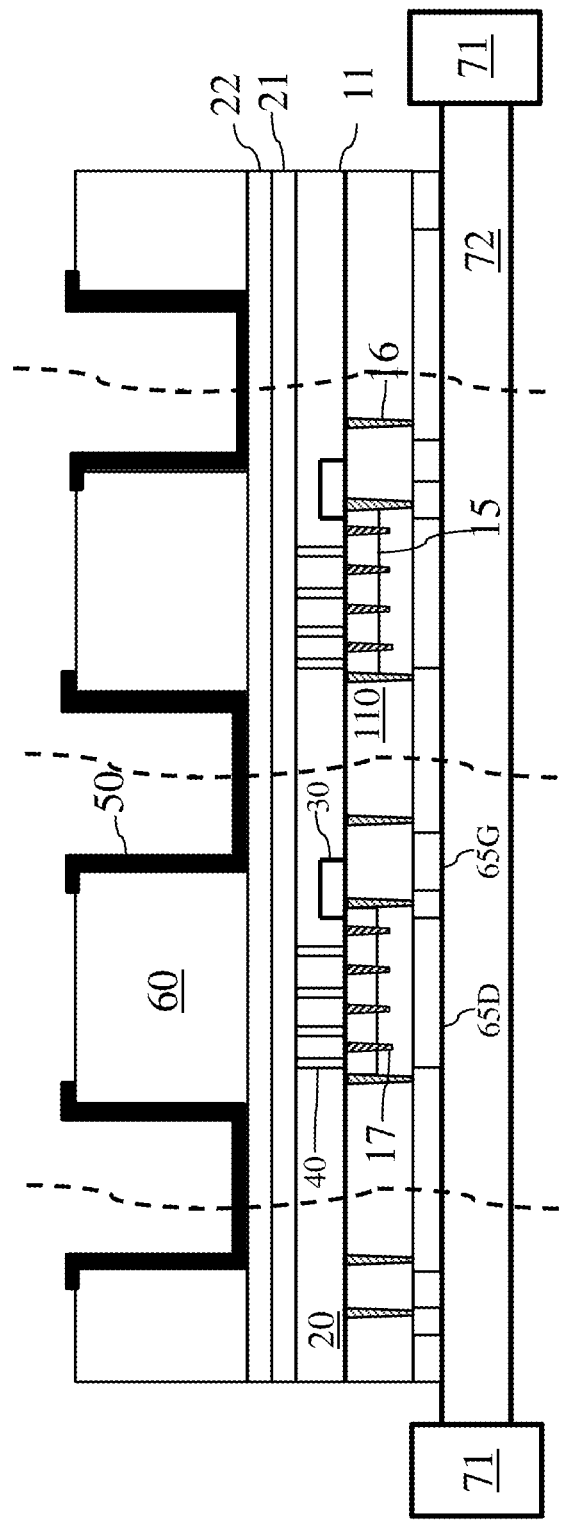

Conventional power MOSFETs are mounted over lead frames or substrates in packages in which the source lead and the gate lead face away from the lead frame. However, when the voltage supported by the power devices is large, the power device produces significant heat, which has to be quickly dissipated away. Typically, heat is dissipated through the underlying lead frame.

Source down configurations are being increasingly used to improve the conduction of the heat away from the power device. In such configurations, the source lead is directly mounted on the lead frame while the drain lead faces away from the lead frame. As the source lead is brought closer to the heat sink, heat dissipation can be improved.

In various embodiments described herein below, the source contact area is modified to encompass substantially all the surface area of the substrate by using the seed layer and the diffusion barrier layer. Accordingly, the seed layer and the diffusion barrier layer used in the formation of the contact pads are not patterned and removed unlike conventional processes.

Embodiments of the present invention will be described further using the methods described in FIGS. 1-3 and the semiconductor package described in FIG. 4.

FIG. 1, which includes FIGS. 1A-1I, illustrates sectional views of a semiconductor device during fabrication in accordance with an embodiment of the present invention.

FIG. 1A illustrates a cross-sectional view of a semiconductor device during fabrication after the completion of front end processing in accordance with an embodiment of the present invention.

Referring to FIG. 1A, a semiconductor substrate 10 after the completion of front end processing is illustrated. The semiconductor substrate 10 has a plurality of semiconductor devices, i.e., chips 1, formed within. Each of the chips 1 may be any type of chip. For example, each of the chips 1 may be a logic chip, a memory chip, an analog chip, a high power switch, and other types of chips. Each of the chips 1 may comprise a plurality of devices such as transistors or diodes forming an integrated circuit or may be a discrete device such as a single transistor or a single diode.

In various embodiments, the semiconductor chip 1 may comprise a power semiconductor device, which may be a discrete vertical device in one embodiment. In one embodiment, the semiconductor chip 1 is a two terminal device such as a PIN diode or a Schottky diode. In one or more embodiments, the semiconductor chip 1 is a three terminal device such as a power metal insulator semiconductor field effect transistor (MISFET or MOSFET), a junction field effect transistor (JFET), bipolar junction transistor (BJT), an insulated gate bipolar transistor (IGBT), or a thyristor.

In one embodiment, the substrate 10 may comprise a semiconductor wafer such as a silicon wafer. In other embodiments, the substrate 10 may be a wafer comprising other semiconductor materials including alloys such as SiGe, SiC or compound semiconductor materials such as GaAs, InP, InAs, GaN, sapphire, silicon on insulation, for example. In various embodiments, the substrate 10 may include a layer of silicon carbide (SiC). In one embodiment, the substrate 10 may include a layer of gallium nitride (GaN).

Accordingly, in one embodiment, the semiconductor chip 1 may comprise a vertical power device formed on a silicon substrate, silicon carbide substrate, a gallium nitride substrate. Alternatively, the semiconductor chip 1 may comprise a lateral power device formed on a substrate comprising a silicon carbide layer, and/or a gallium nitride layer.

As an illustration, the substrate 10 may be a 300 mm silicon wafer, which may have a thickness of about 750 μm to about 800 μm while in another embodiment the substrate 10 may be a 200 mm, 300 mm, or 450 mm silicon wafer, which may have a thickness of about 700 μm to about 750 μm.

Referring to FIG. 1A, device regions 15 are disposed within the substrate 10. The device regions 15 may include doped regions in various embodiments. Further, some portion of the device regions 15 may be formed over the substrate 10. The device regions 15 may include active regions such as channel regions of transistors. The device regions 15 may be isolated using a plurality of isolation regions 16, which may be isolation trenches in one embodiment. As an illustration, the device may include a plurality of trench gates 17 forming the vertical transistor.

The substrate 10 comprises a top surface 11 and an opposite bottom surface 12. In various embodiments, the device regions 15 are formed closer to the top surface 11 of the substrate 10 than the bottom surface 12. Active devices may be formed in device regions 15 of the substrate 10. Device regions 15 extends over a depth, which depending on the device, is about 5 μm to about 50 μm from the top surface 11, and about 10 μm in one embodiment. Further, a final depth of the chip 1 will be determined after thinning as will be described subsequently.

In various embodiments, all necessary interconnects, connections, pads etc. for coupling between devices of the device regions 15 and/or with external circuitry are formed over the substrate 10. Accordingly, a metallization layer 20 is formed over the substrate 10. The metallization layer 20 may comprise one or more levels of metallization. Each level of metallization may comprise metal lines or vias embedded within an insulating layer. The metallization layer 20 may comprise metal lines and vias to contact the device regions 15 and also to couple different devices within each chip 1 such as interconnect 30, which connects the plurality of trench gates 17 to the gate contact region 61.

FIG. 1B illustrates a cross-sectional view of a semiconductor device during fabrication after forming the barrier layer and the seed layer in accordance with an embodiment of the present invention.

Referring to FIG. 1B, a barrier layer 21 and a seed layer 22 are formed over the metallization layer 20. The barrier layer 21 is conformal, and may comprise a single layer of Ta, TaN, WN, WSi, Ti, TiN, Ru, Co and combinations thereof, as examples. Further examples of materials which may be used for the barrier layer 21 include tantalum silicon nitride, tungsten, titanium tungsten or the like. In one specific example, the barrier layer 21 may comprise a layer of tungsten titanium.

The barrier layer 21 may be typically used as a barrier layer for preventing metal from diffusing into the underlying semiconductor material or the metallization layer 20. The barrier layer 21 may be deposited, for example, using a chemical vapor deposition (CVD), physical vapor deposition (PVD) or Atomic layer Deposition (ALD) process.

A seed layer 22 is then deposited saim1larly using, for example, a CVD, PVD, or ALD process over the barrier layer 21. The seed layer 22 may be a seed layer, for example, comprising copper, for subsequent electroplating of copper.

In various embodiments, the barrier layer 21 and the seed layer 22 are deposited using a conformal deposition process leaving a conformal liner or diffusion barrier on the top surface of the metallization layer 20. In one embodiment, the barrier layer 21 comprises tantalum nitride deposited by physical vapor deposition (PVD). A Alternatively, the barrier layer 21 may comprise titanium nitride, tungsten nitride, titanium tungsten, a refractory metal, or other barrier layers that may be conformally deposited, for example, using CVD, PVD processes or electro-less plating. The barrier layer 21 and the seed layer 22 may be deposited in situ in some embodiments.

The seed layer 22 may comprise a metallic material. The seed layer 22 may, for example, comprise a pure metal or an alloy. It is understood that any pure metal may include some amount of trace impurities. An alloy may include at least two metallic elements. An alloy may include a metallic element and a non-metallic element.

The seed layer 22 may comprise one or more of the elements Cu (copper), Al (aluminum), Au (gold), Ag (silver), and W (tungsten). Examples of materials include pure copper, copper alloy, pure aluminum, aluminum alloy, pure gold, gold alloy, pure silver, silver alloy, pure tungsten and tungsten alloy. The seed layer 22 may be formed by a physical vapor deposition or sputtering process.

FIG. 1C illustrates a cross-sectional view of a semiconductor device during fabrication after forming a structured resist layer in accordance with an embodiment of the present invention.

Referring to FIG. 1C, openings 24 for contact pads are formed. In various embodiments, the openings 24 may be formed by depositing a resist layer 23, which may include a hard mask layer and a photo resist layer, and patterning for the contact pad using a combination of lithographing and etching process. The structured resist layer 23 may include developed photo resist layer and one or more layers of hard mask layers underneath the photo resist layer.

The openings 24 expose underlying seed layer 22 for electroplating while blocking portions of the seed layer 22 on which the contact pads are not to be formed.

FIG. 1D illustrates a cross-sectional view of a semiconductor device during fabrication after depositing a conductive material for forming contact pads in accordance with an embodiment of the present invention.

Referring to FIG. 1D, a conductive fill material 25 is deposited over the seed layer 22. The conductive fill material 25 comprises a conductive material in various embodiments. The conductive fill material 25 may comprise a metallic material. The conductive fill material 25 may comprise a pure metal or an alloy.

In various embodiments, the conductive fill material 25 may comprise one or more of the elements Cu (copper), Al (aluminum), Au (gold), Ag (silver), and W (tungsten). Examples of materials include pure copper, copper alloy, pure aluminum, aluminum alloy, pure gold, gold alloy, pure silver, silver alloy, pure tungsten and tungsten alloy.

The conductive fill material 25 may be formed by an electroplating (or electro-deposition) process in one embodiment. In other embodiments, the conductive fill material 25 may be deposited using sputtering, vapor deposition, printing such as screen printing, coating, and others.

The conductive fill material 25 may comprise tungsten in one embodiment, although copper, aluminum, Al—Cu—Si, other metals and combinations thereof may also be used in other embodiments. If the conductive fill material 25 comprises tungsten, preferably a bi-layer seed layer comprising CVD titanium nitride and silicon doped tungsten are used as the barrier layer 21 and the seed layer 22. In other embodiments, the openings 24 are filled with copper.

FIG. 1E illustrates a cross-sectional view of a semiconductor device during fabrication after forming contact pads by removing the resist layer in accordance with an embodiment of the present invention.

As next illustrated in FIG. 1E, the resist layer 23 is removed forming contact pads 60. Further, in some embodiments, the conductive fill material 25 may be planarized, e.g., using a chemical-mechanical polishing (CMP) process.

However, in various embodiments, the seed layer 22 exposed upon the removal of the resist layer 23 is not removed. Therefore, the seed layer 22 and the barrier layer 21 continue to stay over all the substrate 10.

The front side processing is completed with the formation of patterned contact pads 60. An aim1de layer 50 may be deposited over the conductive fill material 25 and the exposed seed layer 22. The aim1de layer 50 is opened, e.g., etched down or alternatively patterned, to expose the patterned contact pads 60.

Typically, a passivation layer is deposited before further processing. The passivation layer is designed to help protect the as well as the device regions 15 during subsequent processing. However, in one or more embodiments, the passivation layer may be omitted as this function may be advantageously be performed using the carrier system.

FIG. 1F illustrates a cross-sectional view of a semiconductor device during fabrication after mounting on a support in accordance with an embodiment of the present invention.

Referring to FIG. 1F, the backside of the substrate 10 is thinned forming a thinned substrate 110 and to expose the new back surface 13. The thinning process may include one or more of mechanical grinding, plasma etching, wet etching, and polishing. The thinning process exposes a plurality of isolation regions 16 thereby isolating the gate contact region 61 from the drain region 62 of the device. Prior to the thinning, the substrate 10 may be mounted on a support 66, for example, a carrier with a tape for stability during thinning and subsequent processing.

FIG. 1G illustrates the semiconductor substrate after formation of a back side metallization layer in accordance with an embodiment of the present invention.

Referring next to FIG. 1G, a back side metallization layer 65 is formed under the exposed back surface 13 of the thinned substrate 110. In various embodiments, the back side metallization layer 65 may comprise more than one metal layer. As an illustration, a first back side metallization layer 120, a second back side metallization layer 130, a third back side metallization layer 140 are illustrated.

In one or more embodiments, the back side metallization layer 65 may be deposited using a physical vapor deposition process. In alternative embodiments, the back side metallization layer 65 may be deposited using other vapor deposition processes including chemical vapor deposition, atomic layer deposition, electrochemical deposition, electro-less deposition, and others.

In various embodiments, the back side metallization layer 65 comprises aluminum. In one or more embodiments, the back side metallization layer 65 comprises multiple layers comprising one or more layers of aluminum, titanium, nickel vanadium, and silver. In another embodiment, the back side metallization layer 65 comprises multiple layers comprising one or more layers of aluminum, titanium, gold tin deposited using a hot physical vapor deposition process in which deposition is performed after heating the thinned substrate 110.

In an alternative embodiment, the back side metallization layer 65 comprises copper. In a further alternative embodiment, the back side metallization layer 65 comprises a solder compatible material, for example, may comprise one or more of silver, tin, gold, platinum, tin, lead, indium, cadmium, bismuth. As described above, specific examples include aluminum layer, titanium layer, nickel vanadium layer, silver, gold-tin, and others for enabling hot aluminum physical vapor deposition for forming low ohmic contacts at the back side of the thinned substrate 110.

In yet other embodiments, the back side metallization layer 65 comprises a metal silicide. In another embodiment, the back side metallization layer 65 comprises a metal nitride such as titanium nitride, tungsten nitride, tantalum nitride.

In various embodiments, the first back side metallization layer 120 is formed by depositing titanium or tungsten, and the second back side metallization layer 130 is formed by depositing aluminum.

In various embodiments, 100 nm to about 500 nm of a third back side metallization layer 140 are deposited. The third back side metallization layer 140 may provide a solder layer for contact formation. Examples of the third back side metallization layer 140 include Au, Ag, Sn, Au alloys, Ag alloys, Sn alloys, and combinations thereof. In other embodiments 100 nm to about 10000 nm of the third back side metallization layer 140 are deposited. In various embodiments, the third back side metallization layer 140 may include multiple layers that form a solder layer, and may also protect the underlying metals from the environment. In some embodiments, copper may be used as the third back side metallization layer 140.

FIG. 1H illustrates the semiconductor substrate after patterning the back side metallization layer in accordance with an embodiment of the present invention.

After patterning, as illustrated in FIG. 1H, the back side metallization layer 65 includes a drain contact 65D and a gate contact 65G, which may include a plurality of metal layers in various embodiments.

FIG. 1I illustrates the semiconductor substrate after singulation in accordance with an embodiment of the present invention.

Referring to FIG. 1I, the thinned substrate 110 is removed from the support 66. The thinned substrate 110 is attached to a tape, which may be a frame like support structure 71 comprising an adhesive tape 72. The thinned substrate 110 is mounted to the adhesive tape 72 within the outer support structure 71. The adhesive tape 72 may be a dicing tape in one embodiment. The support structure 71, which is an annular structure, supports the adhesive tape 72 along the outer edges in one or more embodiments. In another embodiment, the adhesive tape 72 may have a substrate, e.g., polyvinyl chloride, with the coating of an adhesive layer such as an acrylic resin. In one or more embodiments, the support structure 71 comprises a supporting material such as a metal or plastic (ceramic) material. In various embodiments, the inside diameter of the support structure 71 is greater than the diameter of the thinned substrate 110. In alternative embodiments, the support structure 71 may comprise suitable shapes other than being circular.

As illustrated in FIG. 1I, the thinned substrate 110 is firmly secured over the central part of the adhesive tape 72 in one or more embodiments. Accordingly, the thinned substrate 110 may be securely handled during the subsequent singulation process described below.

The thinned substrate 110 may then be singulated forming individual dies. The singulated dies may be removed from the carrier with the tape, for example, by a tape expansion process.

FIG. 2, which includes FIGS. 2A-2K, illustrates a semiconductor device in various stages of fabrication in accordance with an embodiment of the present invention.

Embodiments described in FIG. 1 may be applied to process thin substrates. Modern semiconductor chips are being manufactured at reduced thickness to improve performance, for example, by reducing thermal effects. For example, the ON resistance of the power devices is reduced while improving heat conduction by thinning the substrate thickness. Thin chips are increasingly becoming necessary especially for high power applications. However, very thin chips require processing of thin wafers, which may be thinner than 60 µm. Such thin wafers cannot be processed without additional mechanical support. Accordingly, sophisticated carrier systems are needed to support such thin wafers. Without such carrier systems the processing and assembly of very thin chips is laim1ted.

State of the art systems to support thin wafers use glue to attach a glass carrier wafer on top of the Si wafer. After processing, the glass carrier wafer and the glue are removed. However, thermal stability of such glue based joints is laim1ted, for example, up to 240° C. below 2 minutes. Alternatively, permanent carrier of, e.g., glass grids are connected to the silicon wafer by a glass solder. Thermal stability of those contacts is in the range of 300° C.-800° C. But prepatterned glass grids are mechanically laim1ted as they need glass bars wider than 150 µm. Therefore, these may not be used wafers with small kerfs (e.g., 30 µm-100 µm).

Alternatively, mold compounds are used as carrier systems, for example, in embedded wafer level processing. But such techniques have laim1ted thermal stability, e.g., up to 280° C.

In one more embodiments, a ceramic paste is formed over the wafer followed by a sintering process to form a permanent, thermally stable, and isolating carrier system. After performing the functions of a carrier, the wafer along with the carrier is singulated into individual chips so that portions of the carrier become part of the assembled device.

Figure 2A:
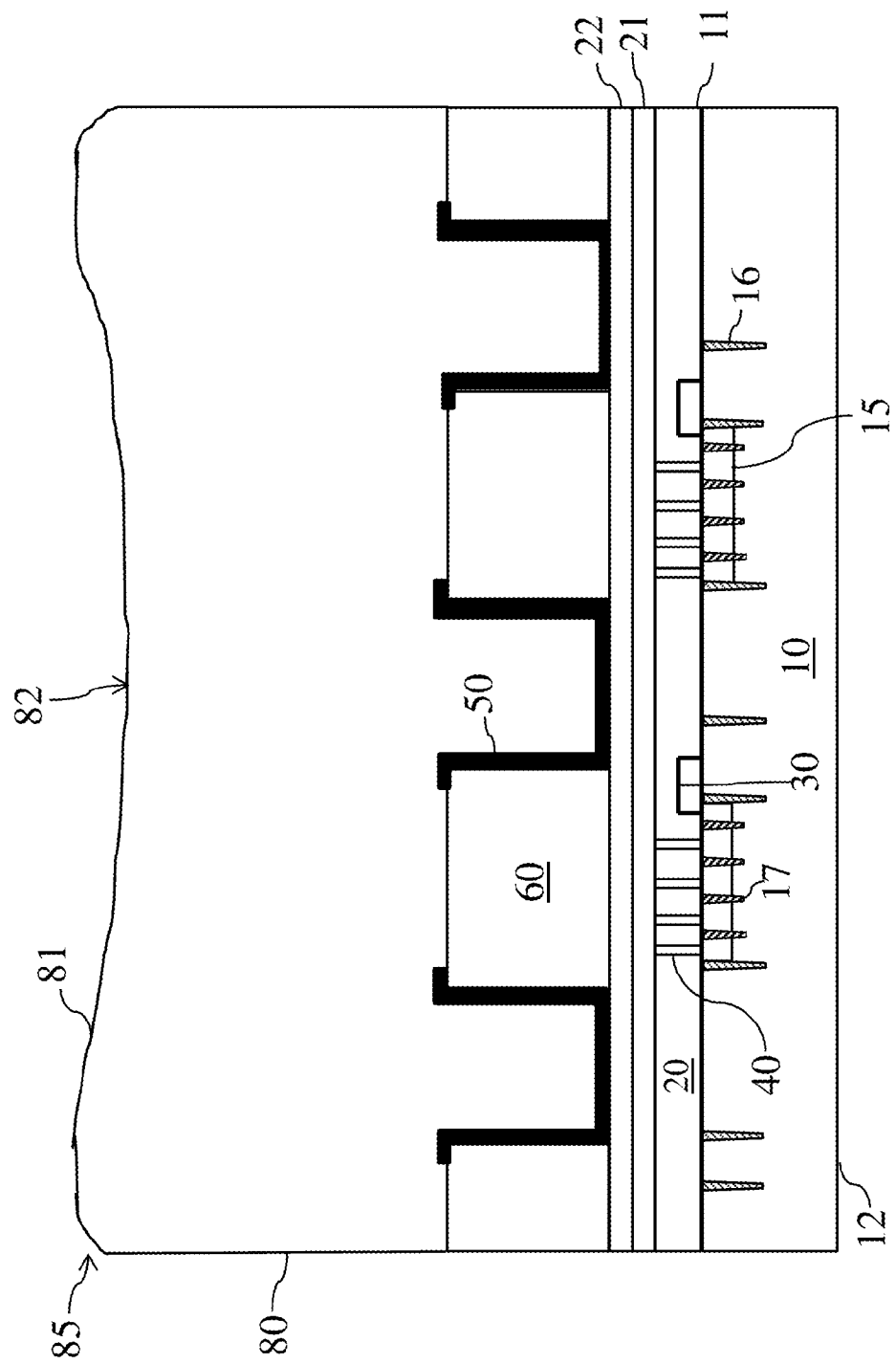
FIG. 2A illustrates the semiconductor substrate after forming front end processing and coating a carrier material in accordance with an embodiment of the present invention.

FIG. 2A illustrates the semiconductor substrate after forming front end processing and coating a carrier material in accordance with an embodiment of the present invention.

As described in the prior embodiment, the front side processing is completed with the formation of patterned contact pads 60. The patterned contact pads 60 may be formed by depositing a thick layer of copper using a plating process. An aim1de layer 50 may be deposited over the thick layer of copper and opened to expose the patterned copper pads 60.

Typically, a passivation layer or protective layer is deposited before further processing. The protective layer is designed to help protect the metallization layer 20 as well as the device regions 15 during subsequent processing. However, in one or more embodiments, the protective layer may be omitted as this function may be advantageously be performed using the carrier system.

In various embodiments, a ceramic paste is deposited over the top surface 11 of the substrate 10. In various embodiments, the ceramic paste is deposited as a liquid using a printing process followed by drying and sintering.

In one alternative embodiment, a coating process is used to deposit the ceramic paste. In other embodiments, the ceramic paste may be deposited using processes such as spin on process, for example, during which a spin on dielectric is deposited. In other embodiments, other deposition processes may be used to deposit the paste.

In one or more embodiments, in addition to ceramic materials, pastes of silicon-oxide, alumina, magnesium oxide, titanium oxide, or saim1lar materials may be printed and sintered to form stable oxides like ceramic pastes or concrete. In various embodiments, the ceramic paste may be a water based mixture and may exhibit self-hardening like concrete.

In various embodiments, the ceramic paste has a slurry like viscosity preventing it from flowing away from the substrate 10. In some embodiments, the ceramic paste may be formed by a mixture of two components that set to form a solid material. In various embodiments, self-solidifying materials may be used as the carrier material.

Additionally in some embodiments, compound materials based on thermally stable polymers filled by organic compounds may also be used. Further embodiments may use powder materials (including ceramics and oxides) that are solidified and/or patterned using laser sintering.

The ceramic paste is sintered (heated) to form a solid material. For example, the sintering may be performed at 380° C. to about 450° C. in one or more embodiments. In another embodiment, sintering is performed at 350° C. to about 450° C. In another embodiment, sintering is performed at 400° C. to about 450° C. In further embodiments, the sintering process may be performed at a lower temperature.

After solidification, the carrier material provides electrical isolation as otherwise the various components on the substrate may create an electrical short.

In various embodiments, the solidified ceramic paste forms a ceramic carrier 80 having a top surface 81. As illustrated in FIG. 2A, the ceramic carrier 80 may have a curved surface because of the surface tension of the deposited ceramic paste and/or the subsequent stress developed during sintering. The curvature of the solidified (sintered) ceramic paste may be further exasperated at edges and corners 85.

In various embodiments, the ceramic carrier 80 has a coefficient of thermal expansion saim1lar to that of silicon.

In one or more embodiment, the thickness of the ceramic carrier 80 is at least 150 µm and about 150 µm to about 800 µm in various embodiments. In one or more embodiment, the thickness of the ceramic carrier 80 is at least 20% to 70% of the thickness of the substrate 10. The thickness of the ceramic carrier 80 is a function of the mechanical properties of the ceramic carrier 80 and the thickness and the diameter of the substrate 10. A larger substrate 10 may require a thicker ceramic carrier 80.

Figure 2B:
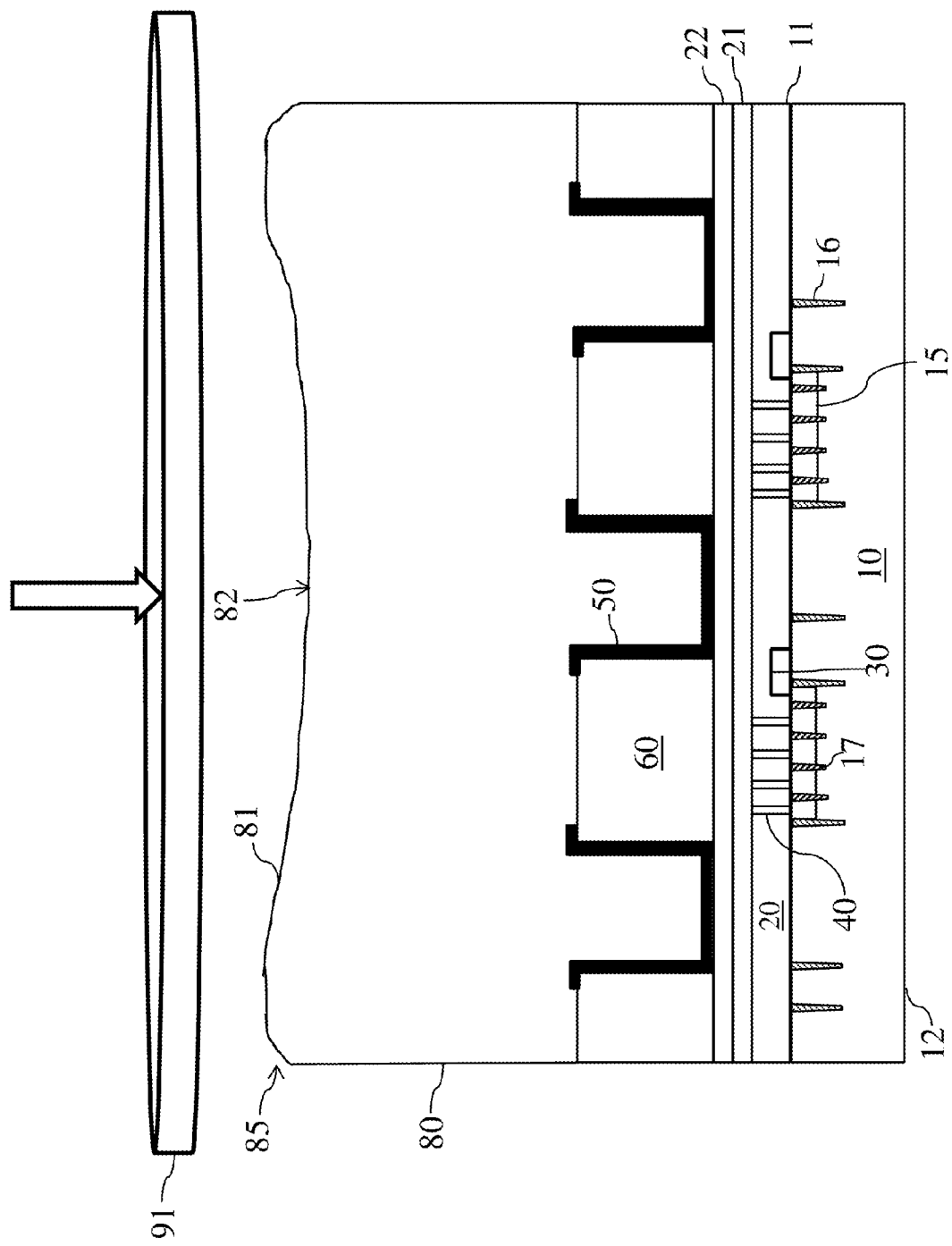
FIG. 2B illustrates a cross-sectional view of a semiconductor device during fabrication during a polishing process for polishing the ceramic carrier in accordance with an embodiment of the present invention.

FIG. 2B illustrates a cross-sectional view of a semiconductor device during fabrication during a polishing process for polishing the ceramic carrier in accordance with an embodiment of the present invention.

Referring to FIG. 2B, the top surface 81 of the ceramic carrier 80 is subjected to a polishing process to remove the curved surface 82. The polishing process may be performed by placing the substrate 10 on a chuck and held in position by vacuum to prevent damaging the substrate 10. A thinning tool 91, which may be a grinding tool in one embodiment, reduces the thickness of the carrier 80. In another embodiment, the thinning tool may use a chemical process such as wet etching or plasma etching to thin the carrier 80.

Figure 2C:
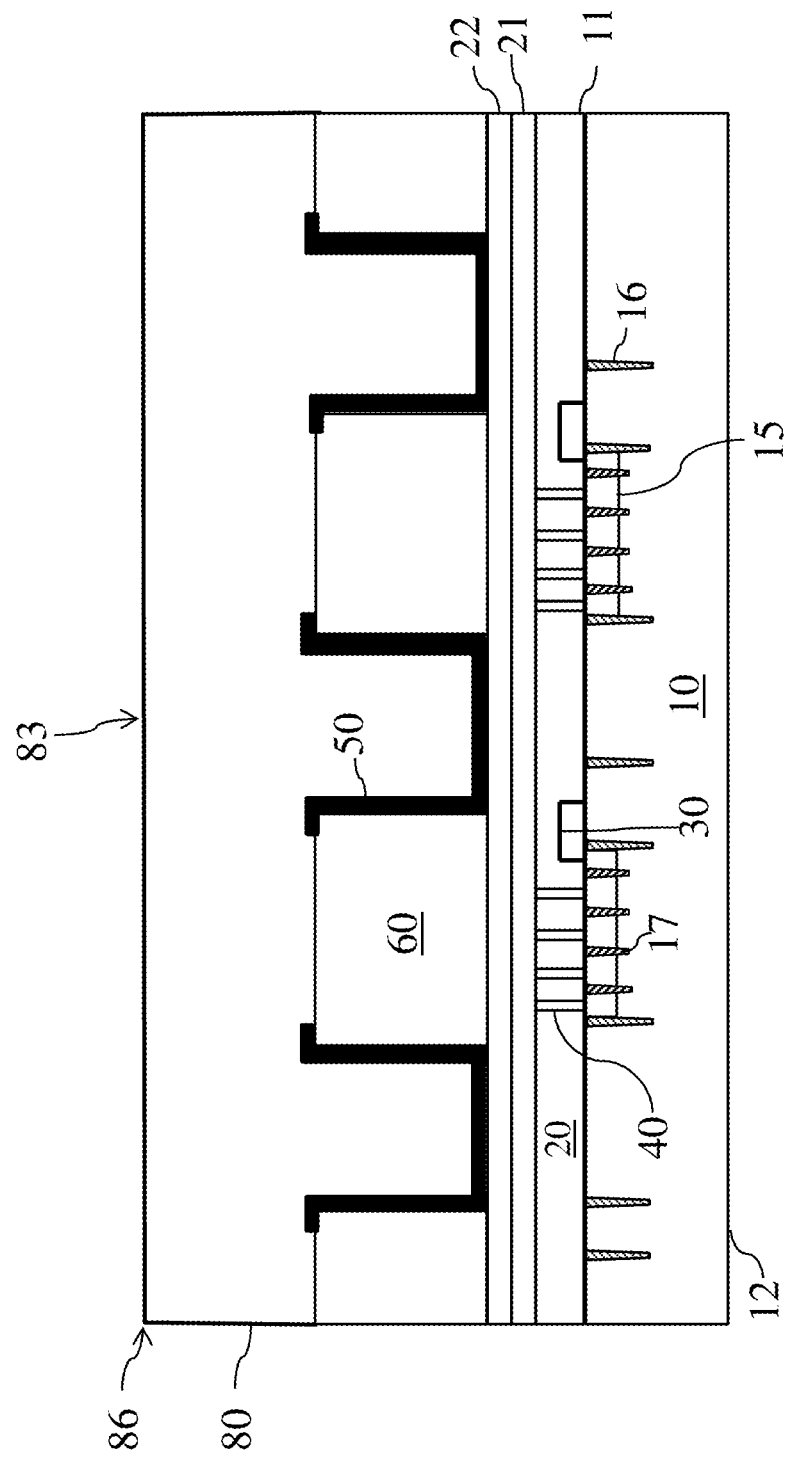
FIG. 2C illustrates a cross-sectional view of a semiconductor device during fabrication after forming a planarised ceramic carrier in accordance with an embodiment of the present invention.

FIG. 2C illustrates a cross-sectional view of a semiconductor device during fabrication after forming a ceramic carrier in accordance with an embodiment of the present invention.

Subsequently, as illustrated in FIG. 2C, after the polishing process, the ceramic carrier 80 may have a planar surface 83. The ceramic carrier 80 may have a thickness of about 60 µm to about 120 µm in various embodiments. In one or more embodiments, the thickness of the ceramic carrier 80 after the thinning is at least 5% to 15% of the thickness of the substrate 10, and about 10% of the substrate 10 in one embodiment. The corners 86 of the carrier 80 after the polishing enable placing the carrier 80 stably during subsequent processing.

Figure 2D:
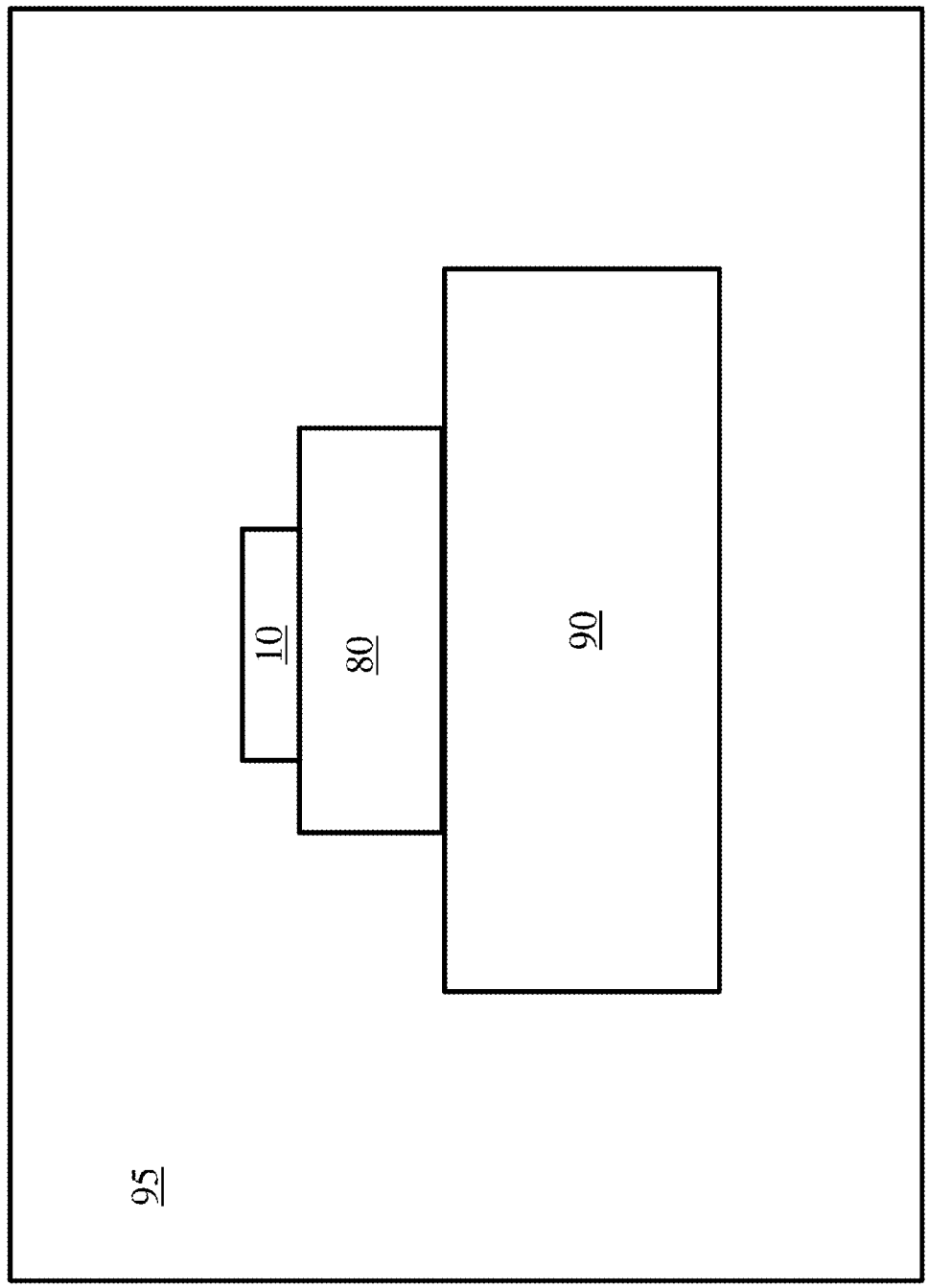
FIG. 2D illustrates processing of the semiconductor substrate using the carrier system in accordance with embodiments of the present invention.

FIG. 2D illustrates processing of the semiconductor substrate using the carrier system in accordance with embodiments of the present invention.

Subsequent processing continues as in conventional processing except that an additional carrier may not be used in accordance with embodiments of the present invention. FIG. 2D illustrates a carrier 80 as formed using embodiments of the invention described above supporting a substrate 10 during subsequent processing. The carrier 80 may be mounted on a chuck 90 and processed within a process chamber 95, for example.

Figure 2E:
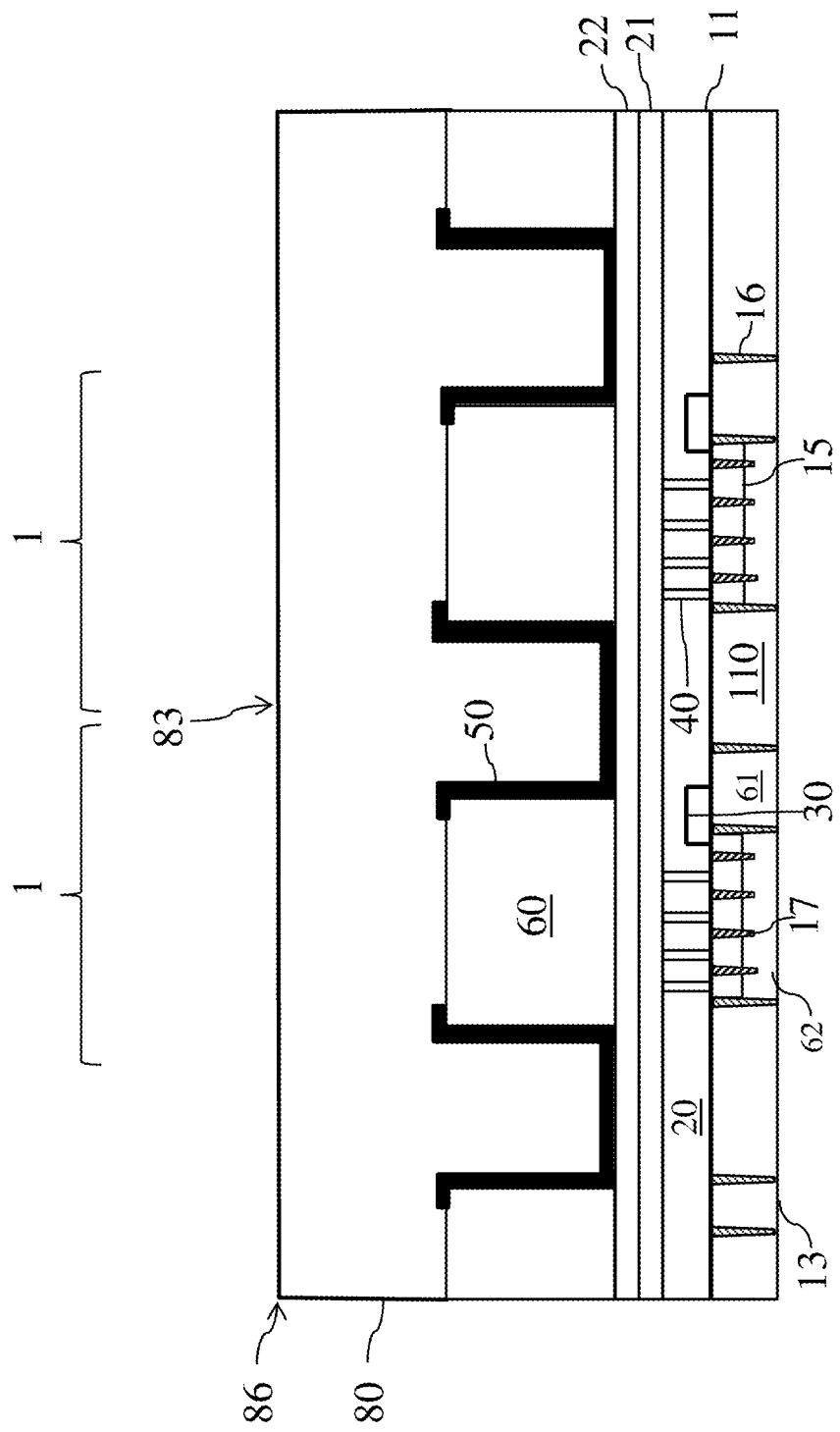
FIG. 2E illustrates a cross-sectional view of a semiconductor device during fabrication after thinning the substrate using the planarised ceramic carrier in accordance with an embodiment of the present invention.

FIG. 2E illustrates a cross-sectional view of a semiconductor device during fabrication after thinning the substrate using the ceramic carrier in accordance with an embodiment of the present invention.

Using the ceramic carrier 80 as a mechanical support, the substrate 10 is thinned from the back side, i.e., from previously bottom surface 12. In various embodiments, the thinning may be performed using a mechanical grinding, chemical etching or a combination of both. The final depth of the chip 1 formed in the substrate 10 will be determined after thinning. A thinning tool, which may be a grinding tool in one embodiment, reduces the thickness of the substrate 10. In another embodiment, the thinning tool may use a chemical process such as wet etching or plasma etching to thin the substrate 10.

In one or more embodiments, the substrate 10 may be thinned without mounting on a tape. In various embodiments, thinning may be flat over the entire wafer backside or patterned by resist patterning and wet or plasma etching. For example, local thinning of substrate 10 by grinding (e.g., as described above) and following resist patterning and wet etching or plasma etching may be needed to realize thin substrate in areas of hot devices and thicker areas for mechanical stability at chip edges.

In one or more embodiments, the substrate 10 after the thinning (i.e., thinned substrate 110) may be 5 µm to about 40 µm. The device regions 15 expose a new back surface 13 of the thinned substrate 110 after the thinning. The device regions 15 are thinned to less than 10 µm, for example.

Figure 2F:
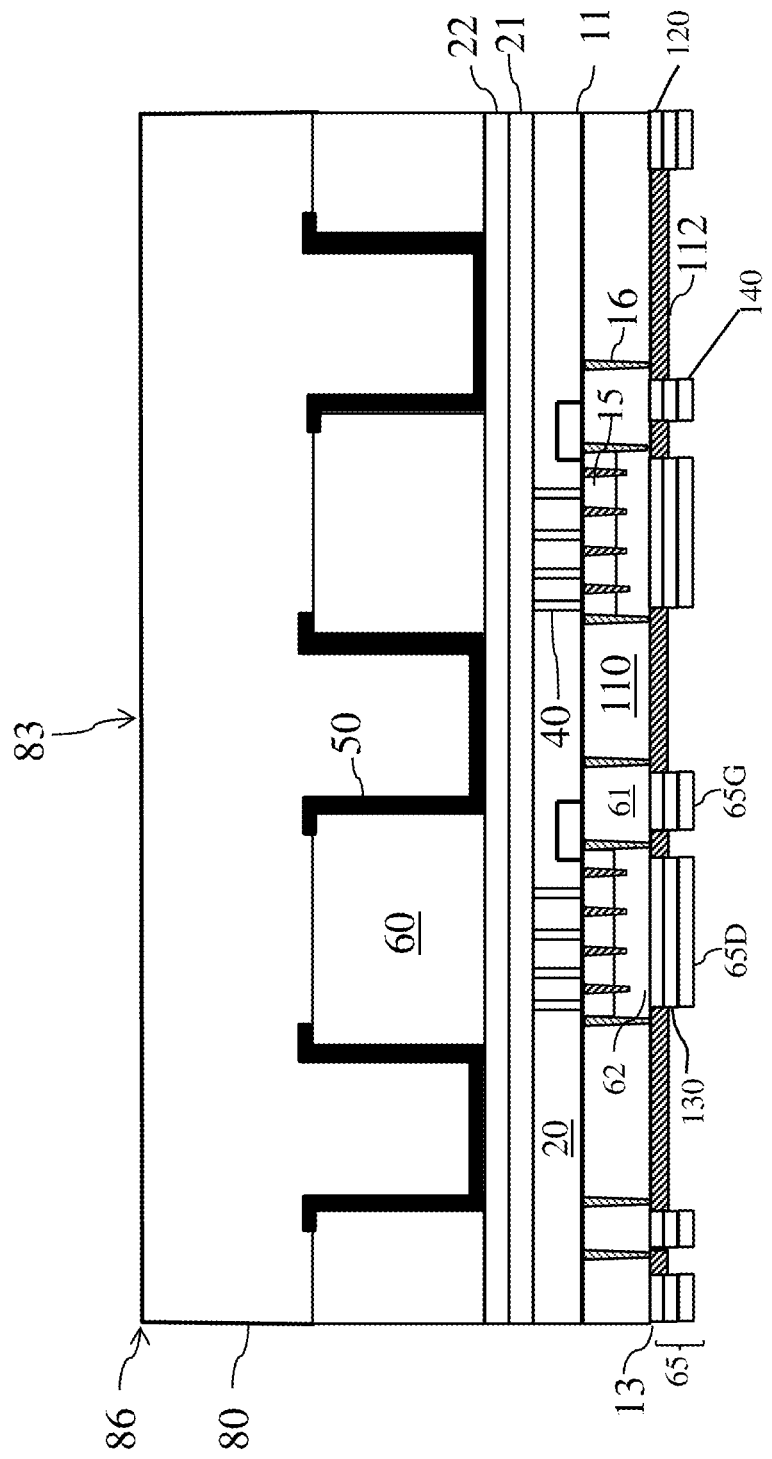
FIG. 2F illustrates a cross-sectional view of a semiconductor device during fabrication after forming a patterned back side metallization layer in accordance with an embodiment of the present invention.

FIG. 2F illustrates a cross-sectional view of a semiconductor device during fabrication after forming a patterned back side metallization layer in accordance with an embodiment of the present invention.

A back side oxidation may be performed followed by patterning. The back side metallization layer 65 is formed between the patterned back side passivation layer 112, which may function as an etch stop layer. The patterned back side passivation layer 112 may include oxide and nitride layers. As described previously, a back side metallization layer 65 is formed and patterned on the exposed back surface 13 of the thinned substrate 110.

Figure 2G:
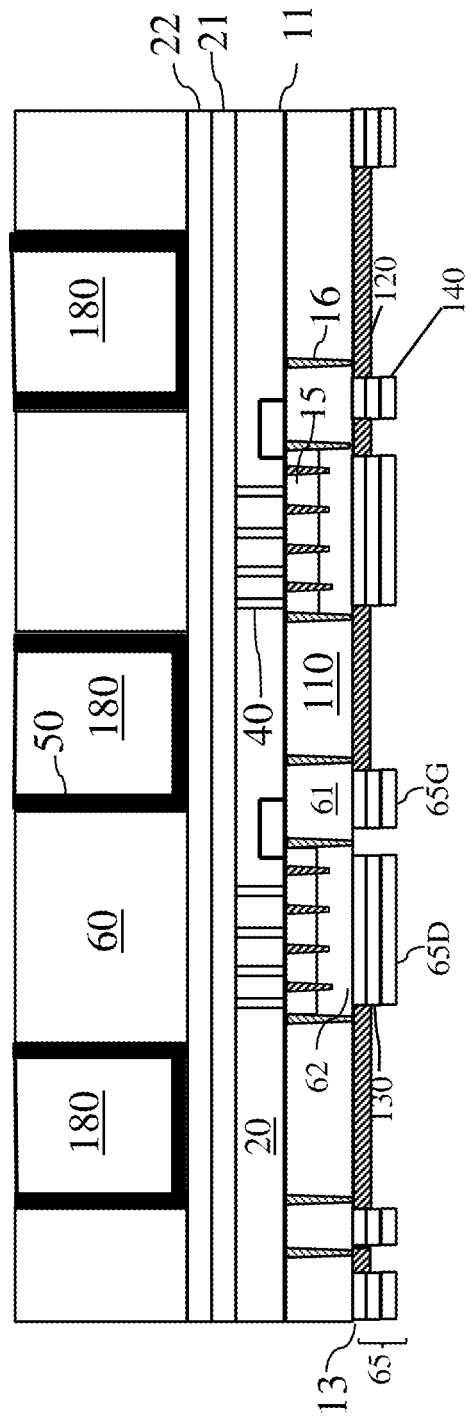
FIG. 2G illustrates the substrate and the carrier after thinning the carrier in accordance with an embodiment of the present invention.

FIG. 2G illustrates the substrate and the carrier after thinning the carrier in accordance with an embodiment of the present invention.

Referring to FIG. 2G, the carrier 80 is thinned to a suitable thickness for packaging. In one embodiment, the thinning of the carrier 80 opens the underlying patterned contact pads 60 so as to leave only a carrier material 180 between adjacent contact pads 60.

In various embodiments, the carrier 80 may be thinned using a grinding process. In one or more embodiments, the thickness of the carrier 80 after the thinning is about 40 µm to about 100 µm. However, the remaining carrier 80 after the thinning is thicker than the remaining thinned substrate 110. Without the carrier 80, the thin layer of thinned substrate 110 may warp and/or mechanically disintegrate. Accordingly, a thickness of the remaining carrier 80 is more than a thickness of the thinned substrate 110.

Figure 2H:
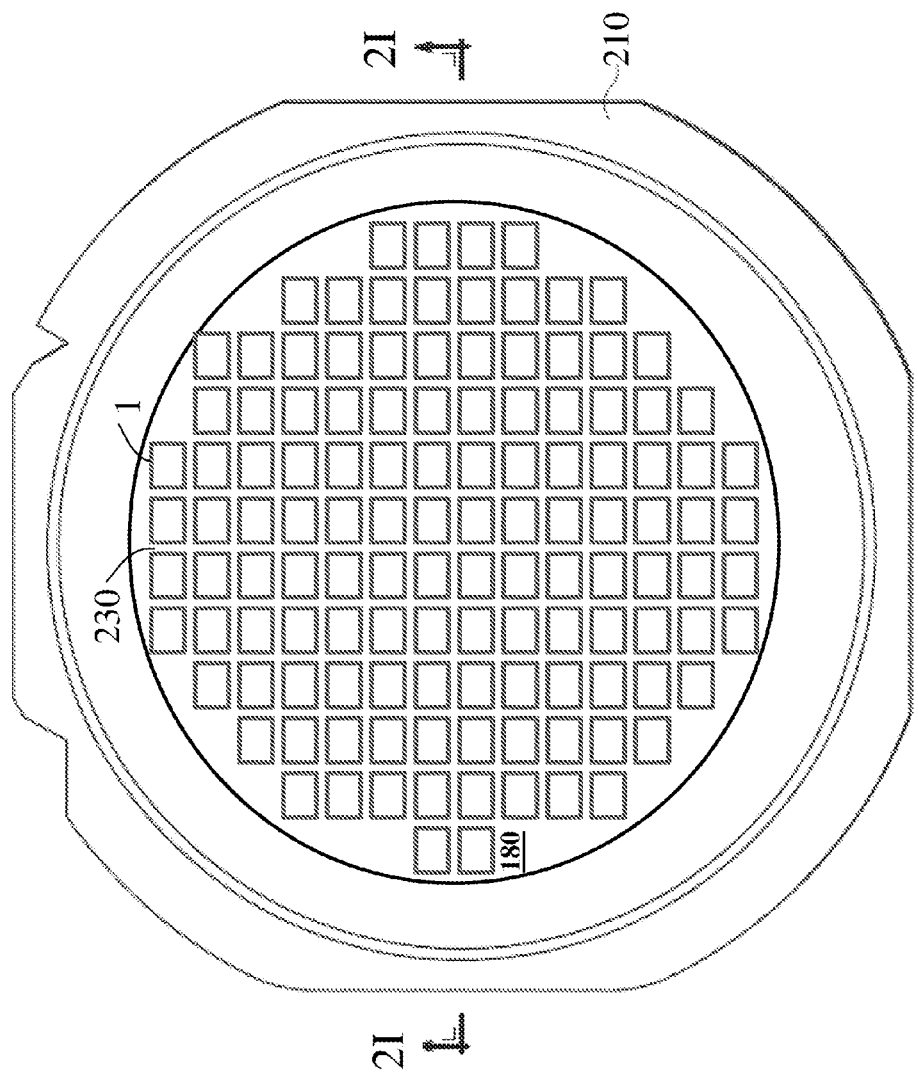
Figure 2I:
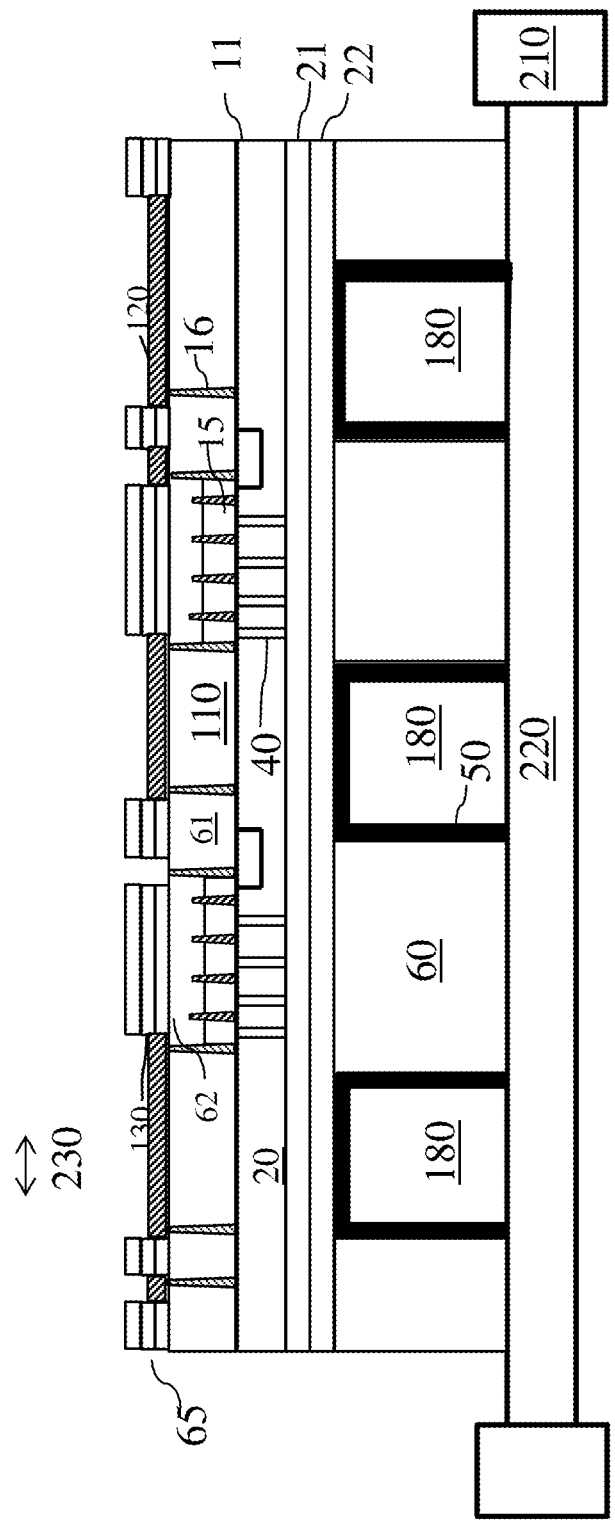

FIGS. 2H and 2I illustrates the carrier and the substrate placed on a frame with a dicing tape in preparation for singulation in accordance with an embodiment of the present invention. FIG. 2H illustrates a top view and FIG. 2I illustrates a cross-sectional view.

Referring to FIG. 2H, the substrate is attached to a frame 210 comprising an adhesive tape 220. The thinned substrate 110 and the carrier 80 are mounted to the adhesive tape 220 within the outer frame 210. The adhesive tape 220 may be a dicing tape in one embodiment. The frame 210 may comprise features saim1lar to the frame described above with respect to FIG. 1I.

In alternative embodiments, if the carrier 80 has a higher intrinsic stress, thinning the carrier 80 without additional mechanical support (as in FIG. 2E) may crack or delaminate the carrier 80. In such embodiments, the carrier 80 with the thinned substrate 110 is attached to the adhesive tape 220 of the frame 210 prior to the thinning of the carrier 80.

As illustrated in FIGS. 2G and 2I, the thinned substrate 110 and the carrier 80 are firmly secured over the central part of the adhesive tape 220 in one or more embodiments. Accordingly, the thinned substrate 110 and the carrier 80 may be securely handled during the subsequent singulation process described below.

Figure 2J:
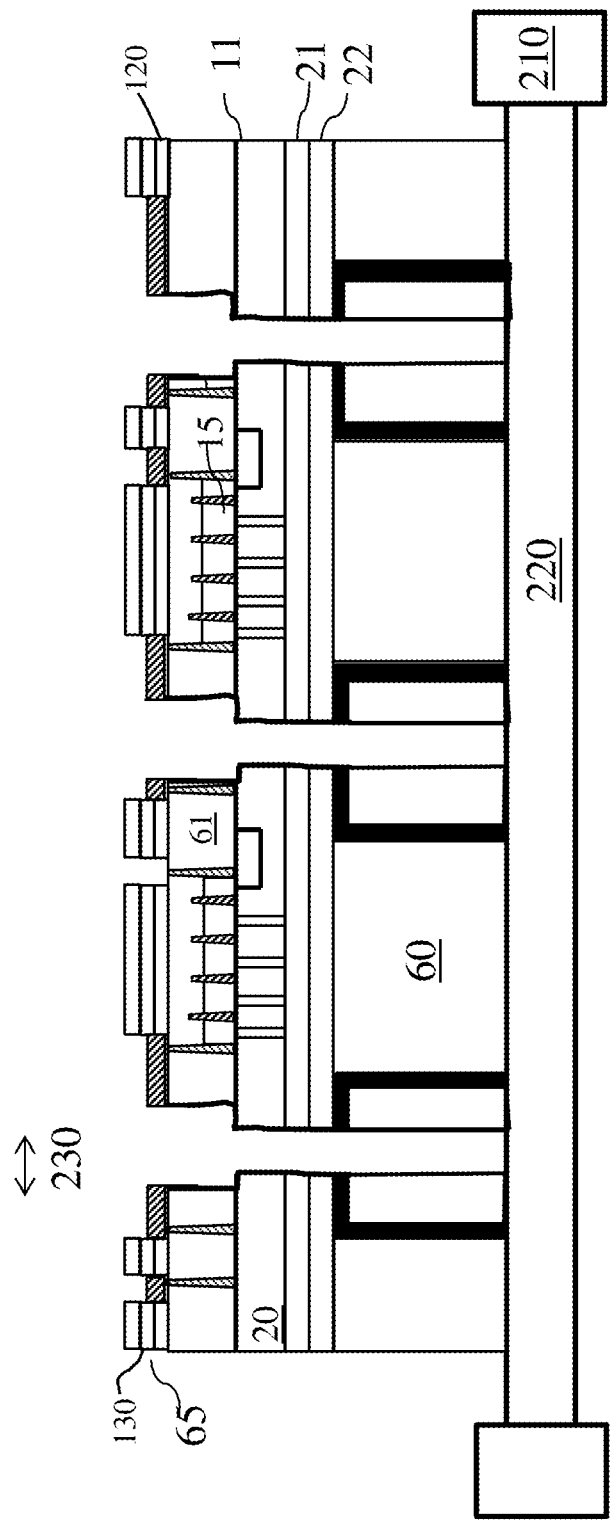
FIG. 2J illustrates a dicing process during a subsequent stage in processing the semiconductor chip in accordance with an embodiment of the present invention.
Figure 2K:
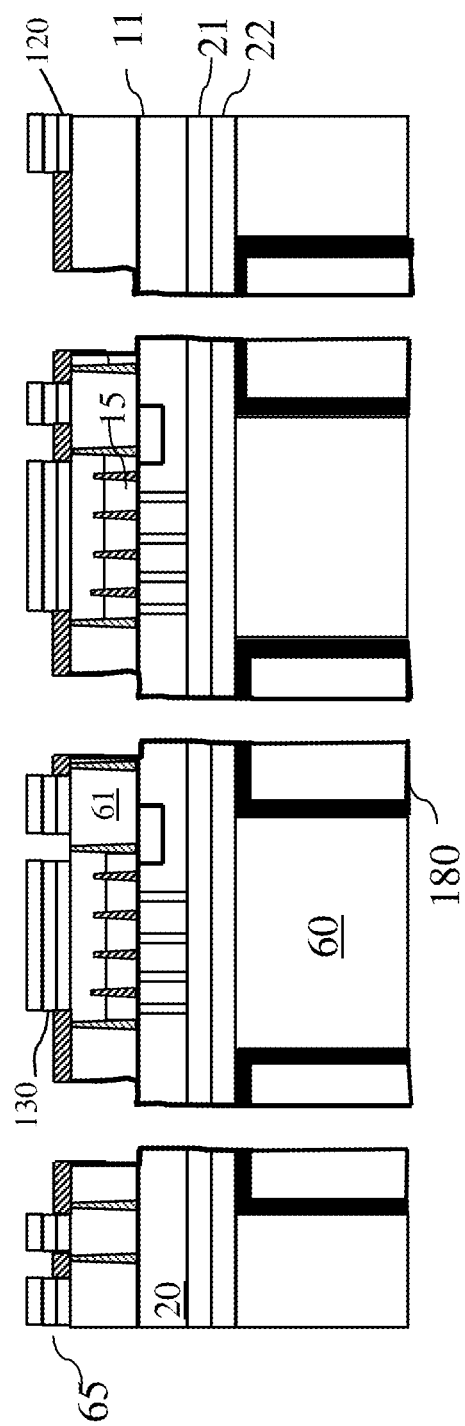
FIG. 2K illustrates a plurality of dies formed after a dicing process in accordance with an embodiment of the present invention.

FIG. 2J illustrates a dicing process during a subsequent stage in processing the semiconductor chip in accordance with an embodiment of the present invention.

As next illustrated in FIG. 2J, a dicing tool 240 is used to dice through dicing regions 230. The dicing regions 230 may be narrow, for example, 30 µm -100 µm in one or more embodiments. In one embodiment, the dicing tool 240 may be sawing blade. The dicing may be performed using a two-step dicing process in one embodiment. In the first step, a broader dicing blade may be used to cut through the carrier material 180 followed by a narrower blade for the thinned substrate 110. The dicing blade cuts through the seed layer 22 and the barrier layer 21 during the dicing.

Figure 3:
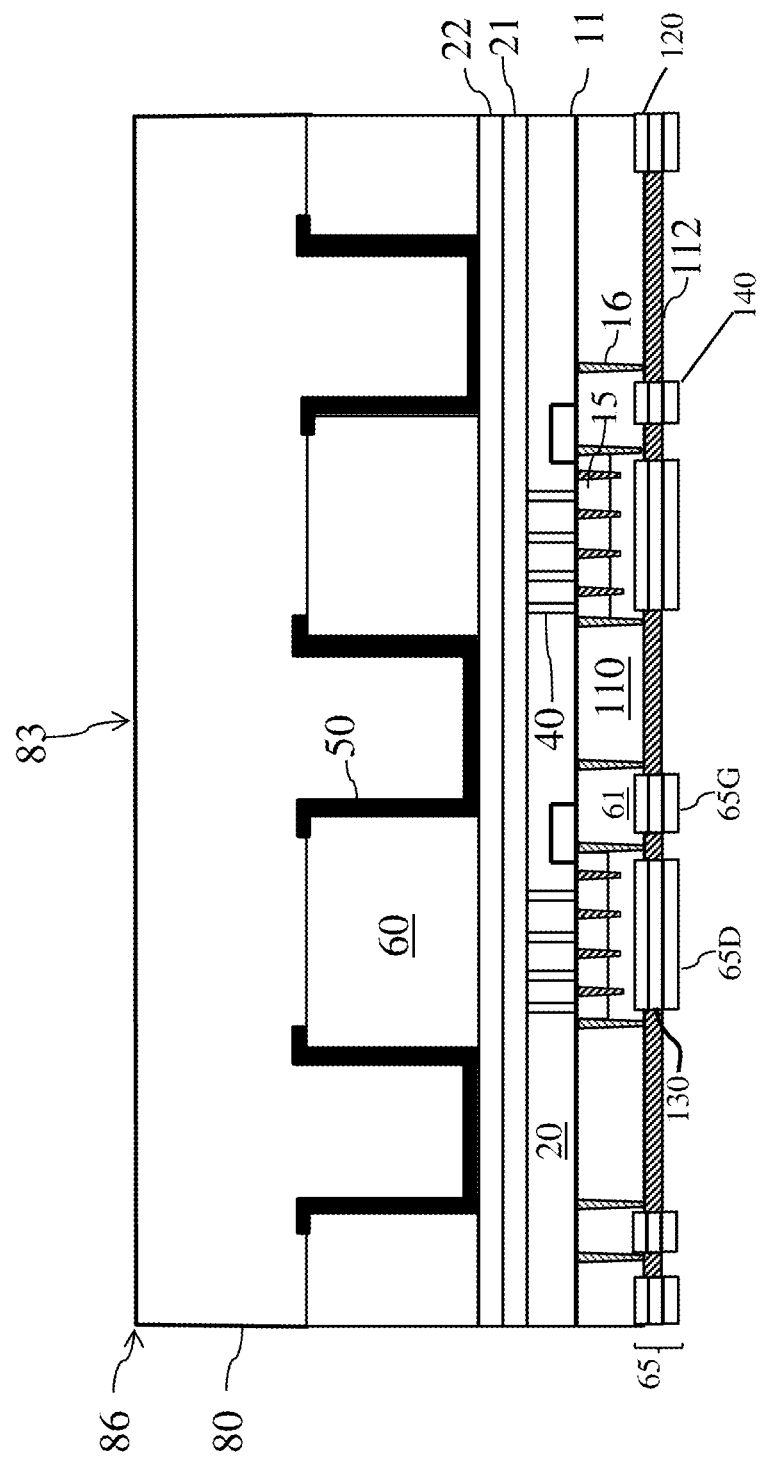
FIG. 3 illustrates a cross-sectional view of a semiconductor device during fabrication after forming a patterned back side metallization layer in accordance with an alternative embodiment of the present invention.

FIG. 3 illustrates a cross-sectional view of a semiconductor device during fabrication after forming a patterned back side metallization layer in accordance with an alternative embodiment of the present invention.

FIG. 3 is an alternative embodiment of the back side metallization illustrated in FIG. 2F and may follow FIGS. 2A-2E. In this embodiment, an additional substrate etch may be performed using the patterned back side passivation layer 112 as an etch mask. Subsequent processing may proceed as described in FIGS. 2G-2K.

Figure 4:
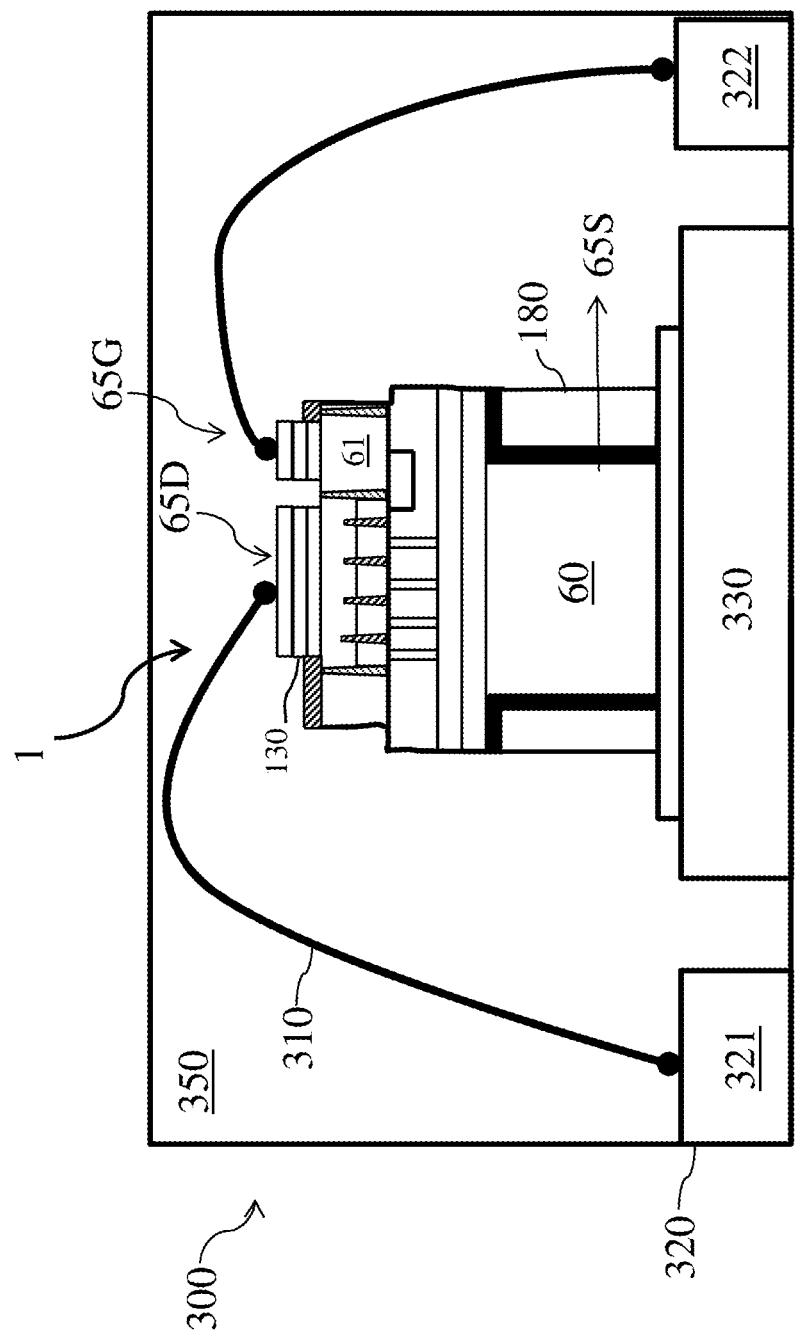
FIG. 4 illustrates a semiconductor package comprising a chip formed in accordance with embodiments of the present invention.

FIG. 4 illustrates a semiconductor package comprising a chip formed in accordance with embodiments of the present invention.

Referring to FIG. 4, a semiconductor package 300 includes a lead frame over which the semiconductor chip 1 is disposed. The semiconductor chip 1 is mounted over a die paddle 330 of the lead frame, which may be a copper lead frame. The lead frame has a plurality of leads 320 which includes a first lead 321, a second lead 322 as examples.

The contacts (drain contact 65D and gate contact 65G) on the front side of the semiconductor chip 1 are coupled to the plurality of leads 320 using the wire bonds 310. The back side contact (contact pad 60 comprising the common source contact 65S) of the semiconductor chip 1 is directly electrically coupled to the die paddle 330. The die paddle 330 is electrically coupled directly to one of the plurality of leads 320.

An encapsulant 350 is disposed around the semiconductor chip 1 and above the die paddle 330. In various embodiments, the semiconductor chip 1 may be packaged using other types of packaging process.

Embodiments may also be used to form a common drain device in which the source contact 65S and the drain contact 65D locations are reversed such that a common drain may be attached to the die paddle 330 while the source and gate contacts are attached to the plurality of leads 320.

As described in various embodiments, a material that comprises a metal may, for example, be a pure metal, a metal alloy, a metal compound, an intermetallic and others, i.e., any material that includes metal atoms. For example, copper may be a pure copper or any material including copper such as, but not laim1ted to, a copper alloy, a copper compound, a copper intermetallic, an insulator comprising copper, and a semiconductor comprising copper.

While this invention has been described with reference to illustrative embodiments, this description is not intended to be construed in a laim1ting sense. Various modifications and combinations of the illustrative embodiments, as well as other embodiments of the invention, will be apparent to persons skilled in the art upon reference to the description. As an illustration, the embodiments described in FIGS. 1-4 may be combined with each other in alternative embodiments. It is therefore intended that the appended claims encompass any such modifications or embodiments.

What is claimed is:

1. A method for forming a semiconductor device, the method comprising:
    forming device regions in a semiconductor substrate comprising a first side and a second side, wherein the device regions are formed adjacent the first side;
    forming a seed layer over the first side of the semiconductor substrate;
    forming a patterned resist layer over the seed layer;
    forming a contact pad over the seed layer within the patterned resist layer;
    removing the patterned resist layer after forming the contact pad to expose a portion of the seed layer underlying the patterned resist layer; and
    forming a protective layer over the exposed portion of the seed layer.

2. The method of claim 1, wherein the protective layer comprises an imide layer.

3. The method of claim 1, wherein the protective layer covers a top surface of the exposed seed layer and sidewalls of the contact pad.

4. The method of claim 1, further comprising:
    mounting the first side of the semiconductor substrate on a carrier; and singulating the semiconductor substrate and the carrier to form a plurality of semiconductor dies.

5. The method of claim 1, wherein the contact pad is a common source contact of a vertical device.

6. The method of claim 1, wherein the seed layer is formed as a blanket layer over an entire major surface of the semiconductor substrate.

7. A method for forming a semiconductor device, the method comprising:
   forming a seed layer over a first side of a semiconductor substrate, the semiconductor substrate comprising device regions at the first side;
   forming a contact pad over the seed layer while exposing a portion of the seed layer adjacent the contact pad;
   forming a protective layer over the exposed portion of the seed layer;
   applying a paste over a semiconductor substrate, the paste covering the protective layer;
   forming a ceramic carrier by solidifying the paste; and
   processing the semiconductor substrate using the ceramic carrier as a carrier.

8. The method of claim 7, wherein the seed layer comprises a copper layer.

9. The method of claim 7, further comprising forming a barrier layer before forming the seed layer.

10. The method of claim 7, wherein the seed layer is formed as a blanket layer over an entire major surface of the semiconductor substrate.

11. The method of claim 7, wherein the contact pad is a common source contact of a vertical device.

12. The method of claim 7, wherein the paste comprises a water based mixture.

13. The method of claim 7, further comprising thinning the ceramic carrier to expose contact pads disposed over the semiconductor substrate after thinning the semiconductor substrate.

14. The method of claim 7, further comprising singulating the ceramic carrier and the semiconductor substrate to form a semiconductor chip.

15. The method of claim 7, wherein solidifying the paste comprises sintering the paste.

16. The method of claim 15, wherein the sintering is performed at 350 ° C. to about 450 ° C.

17. The method of claim 7, wherein forming the ceramic carrier comprises planarizing after solidifying the paste.

18. The method of claim 17, wherein the planarizing reduces a thickness of the solidified paste by at least 50%.

19. The method of claim 7, further comprising:
   thinning the semiconductor substrate from a second side, the second side being opposite to the first side;
   forming a drain pad and a gate pad under the semiconductor substrate after the thinning.

20. The method of claim 19, further comprising forming a passivation layer covering the thinned semiconductor substrate between the drain pad and the gate pad.

21. The method of claim 19, further comprising:
   forming a patterned passivation layer under the semiconductor substrate; and
   etching the thinned semiconductor substrate between the patterned passivation layer before forming the drain pad and the gate pad.

* * * * *